United States Patent [19]

Woo

[11] Patent Number: 4,703,285

[45] Date of Patent: Oct. 27, 1987

[54] WIDEBAND AMPLIFIER WITH ACTIVE HIGH-FREQUENCY COMPENSATION

[75] Inventor: James Woo, Portland, Oreg.

[73] Assignee: Tektronix, Inc., Beaverton, Oreg.

[21] Appl. No.: 855,533

[22] Filed: Apr. 23, 1986

[51] Int. Cl.$^4$ .............................................. H03F 3/45
[52] U.S. Cl. .................................... 330/260; 330/292; 330/294; 330/311
[58] Field of Search .................... 330/76, 78, 94, 252, 330/260, 292, 294, 311

[56] References Cited

U.S. PATENT DOCUMENTS 4,390,848  6/1983  Blauschild ...................... 330/252 X
4,575,687  3/1986  Moore, Jr. ...................... 330/252 X Primary Examiner—James B. Mullins
Attorney, Agent, or Firm—George T. Noe

[57] ABSTRACT

A wideband amplifier with active high-frequency compensation includes an active equivalent RC network connected across the emitters of a differential amplifier. The active RC network exploits inherent junction capacitance and resistance, and is controlled in such a manner that the desired compensation value is provided.

4 Claims, 2 Drawing Figures

WIDEBAND AMPLIFIER WITH ACTIVE HIGH-FREQUENCY COMPENSATION

BACKGROUND OF THE INVENTION

A common amplifier configuration used in electronic instruments is the differential amplifier. Typically, such differential amplifiers comprise a pair of transistors having their emitters coupled together via a resistive-capacitive (RC) network, wherein an input signal is applied across the bases of such pair of transistors and an output signal is developed across the collectors. It is a common technique to provide an adjustable capacitor in the RC network to allow adjustment of high-frequency compensation or high-frequency response of the amplifier.

It has become advantageous for many reasons to implement wideband amplifiers in integrated circuits. Even so, certain circuit elements, also known as discrete components, have had to remain outside the integrated circuit package, either because they cannot be conveniently implemented, or because they involve selection or adjustment as dictated by the operating environment. One such discrete component is the aforementioned adjustable capacitor, which because of associated lead inductance and packaging parasitic capacitances, makes high-frequency adjustments for the amplifier a difficult and often tedious task.

SUMMARY OF THE INVENTION

In accordance with the present invention, a wideband amplifier with active high-frequency compensation includes an active equivalent RC network implemented in an integrated circuit along with differential amplifier components. The active equivalent capacitor portion of the RC network exploits the properties of voltage-dependent junction capacitance of transistors and the equivalent circuit input capacitance of a common-emitter transistor configuration. An optimum amount of capacitance required in the RC network for establishing a desirable high-frequency compensation may be obtained in the present invention by varying either a voltage or a current.

A specific embodiment of an active equivalent RC network for use in a wideband differential amplifier comprises an emitter-coupled pair of transistors and associated circuitry connected between the emitters of a pair of differential amplifier transistors.

Advantages and attainments of the present invention will become apparent to those having ordinary skill in the art upon a reading of the following description when taken in conjunction with the accompanying drawings.

DETAILED DESCRIPTION OF THE INVENTION

This description will be made with reference to both FIG. 1 and FIG. 2, which exemplify different wideband amplifiers employing the active RC network of the present invention.

Figure 1:
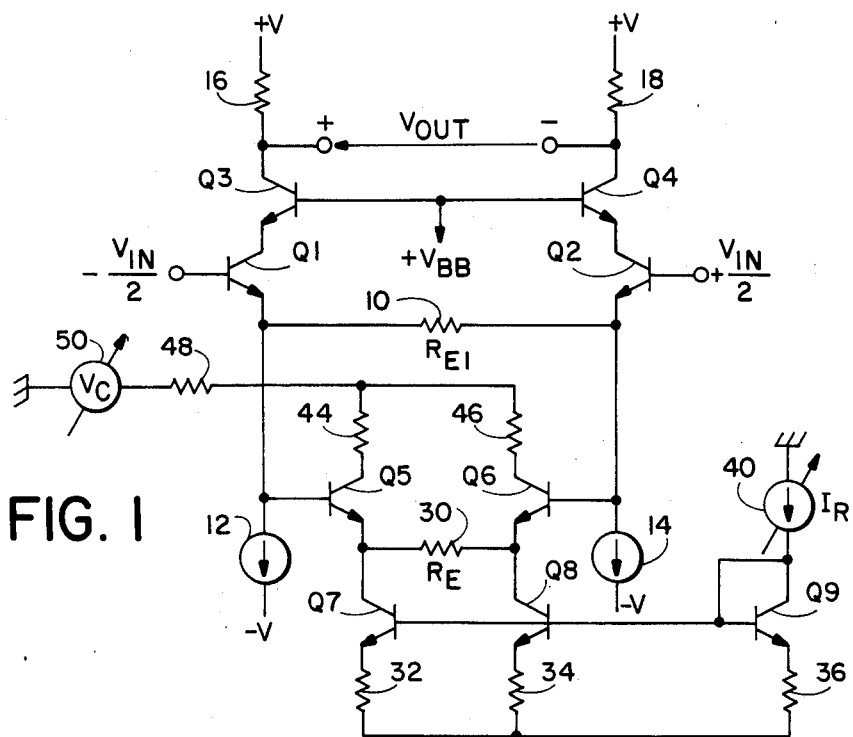
FIG. 1 is a schematic diagram of a cascode amplifier employing the active RC network of the present invention.

In FIG. 1, transistors Q1, Q2, Q3, and Q4 comprise a cascode differential amplifier wherein the emitters of transistors Q1 and Q2 are coupled together through a suitable resistor 10 having a value $R_{E1}$, and the collectors of transistors Q1 and Q2 are coupled to the emitters of common-base amplifier output transistors Q3 and Q4, respectively. The emitters of transistors Q1 and Q2 are also returned through respective current sinks 12 and 14 to a suitable negative voltage supply $-V$. The bases of transistors Q3 and Q4 are connected to a suitable bias voltage supply $+V_{BB}$, while the Q3 and Q4 collectors are connected through respective load resistors 16 and 18 to a suitable positive voltage supply $+V$. An input signal $V_{IN}$ is applied across the bases of transistors Q1 and Q2, and an output signal $V_{OUT}$ is taken across the collectors of transistors Q3 and Q4.

Figure 2:
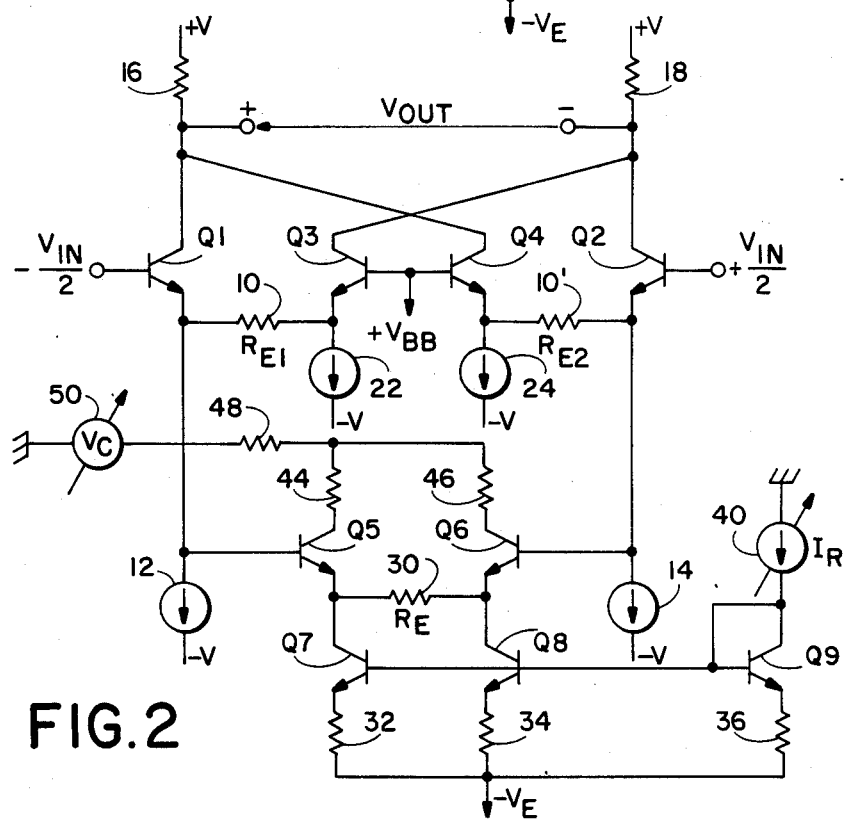
FIG. 2 is a schematic diagram of an $f_T$ doubler amplifier employing the active RC network of the present invention.

In FIG. 2, transistors Q1, Q2, Q3, and Q4 comprise an $f_T$ double differential amplifier wherein the emitters of transistors Q1 and Q3 are coupled together through a resistor 10, while the emitters of transistors Q2 and Q4 are coupled together through a resistor 10'. The emitters of transistors Q1–Q2–Q3–Q4 are also returned through respective current sinks 12–14–22–24 to the negative supply. The bases of transistors Q3 and Q4 are connected to the bias supply voltage. The collectors of transistors Q1 and Q4 are connected through load resistor 16 to the positive supply voltage on one side of the amplifier, while the collectors of transistors Q2 and Q3 are connected through load resistor 18 to the positive supply voltage on the other side. As described above for the cascode configuration, an input signal is applied across the bases of transistors Q1 and Q2, while an output signal is taken across the collectors of transistors Q1–Q4 and Q2–Q3.

For either of the differential amplifier configurations exemplified in FIG. 1 and FIG. 2, an equivalent RC network comprising an emitter-coupled pair of transistors Q5 and Q6, with associated circuit elements, is connected across the emitters of transistors Q1 and Q2. The base of transistor Q5 is connected to the emitter of transistors Q1, the base of transistor Q6 is connected to the emitter of transistor Q2, and the emitters of transistors Q5 and Q6 are coupled together through a resistor 30 having a value $R_E$. The emitter of transistor Q5 is returned to a suitable source of negative supply voltage $-V_E$ through current-sink transistor Q7 and resistor 32, and likewise, the emitter of transistor Q6 is returned to the negative supply through current-sink transistor Q8 and resistor 34. The amount of current through transistors Q7 and Q8 is controlled by a diode-connected transistor Q9 and resistor 36 in current-mirror fashion. That is, the bases of transistors Q7, Q8, and Q9 are connected together to effect control, and the base-to-emitter junction areas of the three transistors are chosen so that the current produced through transistor Q9 is mirrored by a proportional amount in transistors Q7 and Q8. The collector of transistor Q9 is connected to a current source 40 to control the amount of current through transistor Q9, and hence, through transistors Q7 and Q8. Current source 40 is shown as a variable current source; however, in actual practice, current source 40 may be fixed, or it may be programmable to facilitate automatically setting the standing current levels through transistors Q5 and Q6 thereby to establish the equivalent capacitance value, as will be seen shortly.

The collectors of transistors Q5 and Q6 are connected through respective load resistors 44 and 46, and a resistor 48 to a suitable source of control voltage $V_C$, represented by a variable voltage generator 50. Again, in actual practice, voltage generator 50 may be fixed, or it may be programmable to facilitate automatically setting the collector voltage of transistors Q5 and Q6 thereby to set the equivalent capacitance value of the circuit.

The effective equivalent resistance R of the active RC network is the base resistance of transistors Q5 and Q6, which depends largely on base geometry and the particular process used, and resistor 30. The effective equivalent C of the active RC network may be expressed as follows:

$$C = \frac{C_o}{(1 + V_a/V_{bi})^{\frac{1}{2}}} + \frac{T_T}{R_E}$$

wherein $C_o$ is the base-to-collector capacitance of transistors Q5 and Q6 at zero volts, $V_a$ is the collector-to-base voltage of transistors Q5 and Q6, $V_{bi}$ is the built-in base potential of transistors Q5 and Q6, and $T_T$ is the reciprocal of $f_T$ of transistors Q5 and Q6. Variation of the value of C depends upon the applied collector voltage and $f_T$ versus emitter current $I_E$ for a given value of resistance $R_E$.

From the foregoing mathematical expression, it can be discerned that a change in $V_C$ or a change in $I_R$ can be made to provide a value of capacitance to establish a desirable high-frequency response for the differential amplifier of either FIG. 1 or FIG. 2.

The values of resistors 44 and 46 may be chosen to provide a specific time-constant compensation. The values of $V_C$, $I_R$, and resistor 48 must be carefully selected so that the collector-base junction of transistors Q5 and Q6 will not be forward biased within the controlling range.

It should be mentioned that another benefit of this compensation circuit is that it is temperature compensated for the beta loading effect of Q5 and Q6 since the reflected resistance (beta plus one, times $R_E$) is effectively connected across the emitters of the differential amplifier.

The active compensation circuit of the present invention may easily be implemented in integrated circuit form along with the differential amplifier components to provide an amplifier whose high frequency compensation can be optimally set simply by adjusting either a control current or a control voltage.

What I claim as being novel is:

1. In a differential amplifier including a pair of input transistors having an impedance coupled between the emitters thereof, an active high-frequency compensation circuit, comprising:
   a pair of compensation transistors each having a base connected to an emitter of a respective input transistor, wherein the emitters of said compensation transistors are coupled together and the collectors of said compensation transistors are coupled together, said compensation transistors each having a predetermined base-to-collector capacitance;
   first control means for varying the conduction of said compensation transistors; and
   second control means for varying the collector-base voltage of said compensation transistors.

2. An active high-frequency compensation circuit in accordance with claim 1 wherein said first control means comprises variable current generator means connected to the emitters of said compensation transistors.

3. An active high-frequency compensation circuit in accordance with claim 2 further comprising a control circuit connected to said current generator means to establish the level of current generated.

4. An active high-frequency compensation circuit in accordance with claim 1 wherein said second control means comprises a variable voltage generator coupled to the collectors of said compensation transistors.

* * * * *